(12) United States Patent
Gershon et al.

(10) Patent No.: US 10,177,269 B2
(45) Date of Patent: Jan. 8, 2019

(54) CONTROLLABLE INDIUM DOPING FOR HIGH EFFICIENCY CZTS THIN-FILM SOLAR CELLS

(71) Applicant: INTERNATIONAL BUSINESS MACHINES CORPORATION, Armonk, NY (US)

(72) Inventors: Talia S. Gershon, White Plains, NY (US); Jeehwan Kim, Los Angeles, CA (US); Yun Seog Lee, White Plains, NY (US); Teodor K. Todorov, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 44 days.

(21) Appl. No.: 14/749,272

(22) Filed: Jun. 24, 2015

(65) Prior Publication Data

US 2016/0359076 A1 Dec. 8, 2016

Related U.S. Application Data

(63) Continuation of application No. 14/728,364, filed on Jun. 2, 2015.

(51) Int. Cl.
| | | |
|---|---|---|
| *H01L 21/00* | (2006.01) | |
| *H01L 31/18* | (2006.01) | |
| *H01L 31/072* | (2012.01) | |
| *H01L 31/032* | (2006.01) | |

(52) U.S. Cl.
CPC .......... *H01L 31/18* (2013.01); *H01L 31/0326* (2013.01); *H01L 31/0327* (2013.01); *H01L 31/072* (2013.01); *Y02E 10/50* (2013.01)

(58) Field of Classification Search
CPC .......... H01L 21/02568; H01L 31/1864; H01L 31/0327; H01L 31/02167; H01L 31/0326; H01L 31/072; H01L 31/18; Y02E 10/541; Y02E 10/50
USPC ...................................................... 438/48, 57
See application file for complete search history.

(56) References Cited

U.S. PATENT DOCUMENTS

| | | | |
|---|---|---|---|
| 4,366,337 A | | 12/1982 | Alessandrini et al. |
| 4,536,607 A | | 8/1985 | Weismann |
| 4,796,082 A | * | 1/1989 | Murakami ........ H01L 21/28575 257/624 |
| 5,304,499 A | * | 4/1994 | Bonnet ................. H01L 31/073 136/260 |

(Continued)

FOREIGN PATENT DOCUMENTS

WO WO2013189971 * 12/2013

OTHER PUBLICATIONS

List of IBM Patents or Patent Applications Treated as Related.

*Primary Examiner* — Duy T Nguyen
(74) *Attorney, Agent, or Firm* — Tutunjian & Bitetto, P.C.; Erik Johnson

(57) ABSTRACT

A photovoltaic device includes a first contact layer formed on a substrate. An absorber layer includes Cu—Zn—Sn—S(Se) (CZTSSe) on the first contact layer. A buffer layer is formed in contact with the absorber layer. Metal dopants are dispersed in a junction region between the absorber layer and the buffer layer. The metal dopants have a valence between the absorber layer and the buffer layer to increase junction potential. A transparent conductive contact layer is formed over the buffer layer.

12 Claims, 5 Drawing Sheets

(56) References Cited

U.S. PATENT DOCUMENTS

| | | | |
|---|---|---|---|
| 2012/0031492 A1* | 2/2012 | Sevvana | H01L 21/02491 |
| | | | 136/262 |
| 2013/0081670 A1 | 4/2013 | Ashley et al. | |
| 2013/0092236 A1 | 4/2013 | Kim | |
| 2013/0153860 A1* | 6/2013 | Kim | H01L 51/0002 |
| | | | 257/14 |
| 2013/0327398 A1 | 12/2013 | Dhere et al. | |
| 2015/0325722 A1* | 11/2015 | Palm | H01L 31/0322 |
| | | | 136/256 |

\* cited by examiner

CONTROLLABLE INDIUM DOPING FOR HIGH EFFICIENCY CZTS THIN-FILM SOLAR CELLS

RELATED APPLICATION DATA

This application is a Continuation application of co-pending U.S. patent application Ser. No. 14/728,364 filed on Jun. 2, 2015, incorporated herein by reference in its entirety.

BACKGROUND

Technical Field

The present invention relates to photovoltaic devices and methods for making the same, and more particularly to a solar cell with doping at a CdS/CZTS interface.

Description of the Related Art

Cu—In—Ga—S/Se (CIGSSe) technology provides high performance solar cells with very high power conversion efficiency (PCE) (e.g., about 20%). CIGSSe solar cells have a very large open circuit voltage (Voc) relative to bandgap with no known issues of interface recombination. Unfortunately the reliance on rare elements, such as indium, for example, limits very large scale deployment of this technology.

Cu—Zn—Sn—S/Se (CZTSSe) is an emerging thin film solar cell technology consisting of all earth abundant elements. While progress has been made in the development of CZTSSe solar cells particularly using hydrazine-based solution processing, a PCE of only about 12.6% has been achieved.

Several major limitations in CZTSSe solar cells exist as well. For example, a low open circuit voltage (Voc) may be experienced, which is suspected to be due to high buffer-absorber interface recombination, high bulk defect states, existence of tail states in the bulk and possible Fermi level pinning in the bulk or at an interface. Furthermore, CZTSSe also suffers from low fill factor (FF) which is mostly due to low Voc and higher series resistance from various layers or potential barrier formation across the device.

SUMMARY

A photovoltaic device includes a first contact layer formed on a substrate. An absorber layer includes Cu—Zn—Sn—S(Se) (CZTSSe) on the first contact layer. A buffer layer is formed in contact with the absorber layer. Metal dopants are dispersed in a junction region between the absorber layer and the buffer layer. The metal dopants have a valence between the absorber layer and the buffer layer to increase junction potential. A transparent conductive contact layer is formed over the buffer layer.

Another photovoltaic device includes a first contact layer formed on a substrate and an absorber layer including Cu—Zn—Sn—S(Se) (CZTSSe) on the first contact layer. A CdS buffer layer is formed in contact with the absorber layer. In metal dopants are dispersed in a junction region between the absorber layer and the buffer layer. The metal dopants have a valence between the absorber layer and the buffer layer to increase junction potential. A transparent conductive contact layer is formed over the buffer layer.

A method for forming a photovoltaic device includes providing an absorber layer including Cu—Zn—Sn—S(Se) (CZTSSe) on a first contact layer formed on a substrate; forming a buffer layer in contact with the absorber layer; doping a junction region between the absorber layer and the buffer layer with metal dopants having a valence between the absorber layer and the buffer layer to increase junction potential; and forming a transparent conductive contact layer over the buffer layer.

These and other features and advantages will become apparent from the following detailed description of illustrative embodiments thereof, which is to be read in connection with the accompanying drawings.

BRIEF DESCRIPTION OF THE SEVERAL VIEWS OF THE DRAWINGS

The disclosure will provide details in the following description of preferred embodiments with reference to the following figures wherein.

DETAILED DESCRIPTION

Figure 1:
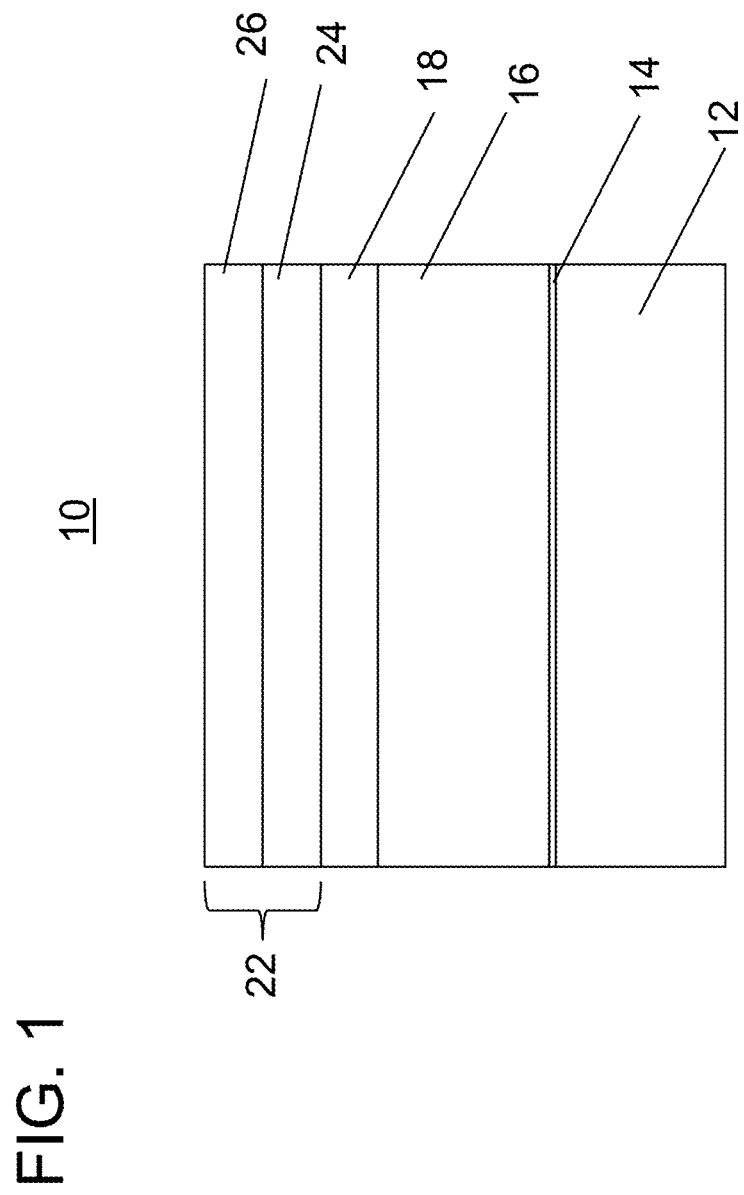
FIG. 1 is a cross-sectional view of a photovoltaic device having a doped junction region between a CZTS absorber layer and a buffer layer in accordance with the present principles.

In accordance with the present principles, a Cu$_2$(Zn,Sn)(S,Se)$_4$ (CZTSSe) photovoltaic device is provided that includes benefits of earth-abundant constituent elements of the CZTSSe and may provide higher performance than conventional CZTSSe devices. The CZTSSe may be grown as a single crystal and transferred to a substrate where it can be employed as an absorber layer in a photovoltaic device, such as, e.g., a solar cell. In other embodiments, the CZTSSe (polycrystalline) may be formed on a Mo coated substrate. Single crystal CZTSSe devices may provide higher power conversion efficiency.

In one illustrative embodiment, a buffer layer may include CdS or other material formed on the CZTSSe layer. In accordance with the present principles, a thin indium metal layer is formed, e.g., by thermal evaporation, on the buffer layer and then diffused by an anneal process. The indium diffuses into the CdS/CZTSSe junction to enhance the operating parameters of the device.

It is to be understood that the present invention will be described in terms of a given illustrative architecture having substrates and photovoltaic stacks; however, other architectures, structures, substrates, materials and process features and steps may be varied within the scope of the present invention.

It will also be understood that when an element such as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

A design for a photovoltaic device may be created for integrated circuit integration or may be combined with components on a printed circuit board. The circuit /board may be embodied in a graphical computer programming language, and stored in a computer storage medium (such as a disk, tape, physical hard drive, or virtual hard drive such as in a storage access network). If the designer does not fabricate chips or the photolithographic masks used to fabricate chips or photovoltaic devices, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein may be used in the fabrication of photovoltaic devices and/or integrated circuit chips with photovoltaic devices. The resulting devices/chips can be distributed by the fabricator in raw wafer form (that is, as a single wafer that has multiple unpackaged devices/chips), as a bare die, or in a packaged form. In the latter case, the device/chip is mounted in a single chip package (such as a plastic carrier, with leads that are affixed to a motherboard or other higher level carrier) or in a multichip package (such as a ceramic carrier that has either or both surface interconnections or buried interconnections). In any case, the devices/chips are then integrated with other chips, discrete circuit elements, and/or other signal processing devices as part of either (a) an intermediate product, such as a motherboard, or (b) an end product. The end product can be any product that includes integrated circuit chips, ranging from toys, energy collectors, solar devices and other applications including computer products or devices having a display, a keyboard or other input device, and a central processor. The photovoltaic devices described herein are particularly useful for solar cells or panels employed to provide power to electronic devices, homes, buildings, vehicles, etc.

It should also be understood that material compounds will be described in terms of listed elements, e.g., Cu—Zn—Sn—S(Se) (CZTSSe). The compounds described herein may include different proportions of the elements within the compound, e.g., $Cu_{2-x}Zn_{1+y}Sn(S_{1-z}Se_z)_{4+q}$ wherein $0 \leq x \leq 1$; $0 \leq y \leq 1$; $0 \leq z \leq 1$; $-1 \leq q \leq 1$, etc. In addition, other elements may be included in the compound, such as, e.g., dopants, and still function in accordance with the present principles. The compounds with additional elements will be referred to herein as alloys.

The present embodiments may be part of a photovoltaic device or circuit, and the circuits as described herein may be part of a design for an integrated circuit chip, a solar cell, a light sensitive device, etc. The photovoltaic device may be a large scale device on the order of feet or meters in length and/or width, or may be a small scale device for use in calculators, solar powered lights, etc.

It is also to be understood that the present invention may be employed in a tandem (multi-junction) structure having multiple layers of single crystal absorber layers transferred to a same substrate or layer. Other architectures, structures, substrate materials and process features and steps may be varied within the scope of the present invention. The tandem structure may include one or more stacked cells.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

It is to be appreciated that the use of any of the following "/" "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

Referring now to the drawings in which like numerals represent the same or similar elements and initially to FIG. 1, an illustrative photovoltaic structure 10 is illustratively depicted in accordance with one embodiment. The photovoltaic structure 10 may be employed in solar cells, light sensors, photosensitive devices or other photovoltaic applications. The structure 10 includes a substrate 12. The substrate 12 may include glass or other inexpensive substrate, such as metal, plastic or other material suitable for photovoltaic devices (e.g., quartz, silicon, etc.). A conductive layer 14 is formed on the substrate 12. Conductive layer 14 may be omitted if a conductive substrate 12 is employed. The conductive layer 14 may include molybdenum although other high work-function materials may be employed (e.g., Pt, Au, etc.). The layer 14 provides a metal contact.

An absorber layer includes a single crystal (monocrystalline) CZTSSe layer 16 transferred to the conductive layer 14 or a polycrystalline CZTSSe layer 16, if grown on the conductive layer 14. Layer 16 includes a Cu—Zn—Sn containing chalcogenide compound with a kesterite structure of the formula: $Cu_{2-x}Zn_{1+y}Sn(S_{1-z}Se_z)_{4+q}$ wherein $0 \leq x \leq 1$; $0 \leq y \leq 1$; $0 \leq z \leq 1$; $-1 \leq q \leq 1$ (hereinafter CZTSSe). Layer 16 forms the absorber layer. In a particularly useful embodiment, the Cu—Zn—Sn-containing chalcogenide includes $Cu_2ZnSn(S,Se)_4$. In one embodiment, the CZTSSe film or layer 16 has a thickness of between about 0.2 to 4.0 microns and more preferably about 2 microns. Layer 16 may be grown remotely and transferred for placement on a substrate 12 coated with a conductive material 14 such as Mo.

In one illustrative embodiment, layer 16 includes CZTS (or CZTS with some Se substituted for S) which provides a band gap ($E_g$) from about 1 to 1.5 eV. Although the major elements in CZTS are Cu, Zn, Sn, S, Se, reference to CZTSSe or Cu—Zn—Sn containing chalcogenide material also includes compositions that optionally contain Ge replacing some or all of the Sn and contain Fe replacing some or all of the Zn and that may also contain other dopants, including Sb, Bi, Na, K, Li, Ca, etc.

CZTSSe has many benefits. It is low cost and environmentally harmless, being fabricated using naturally abundant materials. CZTSSe provides good optical properties and has a band-gap energy from approximately 1 to 1.5 eV, depending on the degree of substitution of S with Se, and a large absorption coefficient in the order of $10^4$ cm$^{-1}$.

A semiconductor material 18 (buffer layer), e.g., CdTe, CdSe, CdS, ZnS, Zn(O,S), ZnO etc. may be formed as monocrystalline structures, although semiconductor material 18 may include polycrystalline and even amorphous material. In a particularly useful embodiment, layer 18 includes CdS.

In one conventional structure, a second semiconductor material, for example, $In_2S_3$, is formed over the first semiconductor layer (e.g., layer 18), if the first semiconductor layer includes CdS. In accordance with the present principles, such a $In_2S_3$ layer is eliminated.

Instead, in accordance with the present principles, In metal is diffused through the layer 18 to reach the junction between the layer 18 and layer 16. By diffusing In into the junction, built-in potential is increased for the junction, and the performance of the device 10 is improved. In some embodiments, the layer 18 may include a thickness of between about 0.05 to about 2.0 microns, and the CZTSSe layer 16 may include a thickness of between about 0.2 to about 4.0 microns. Although other thicknesses and combinations are contemplated.

A transparent conductive layer 22 is formed over the layer 18. The transparent conductive layer 22 may include a transparent conductive oxide (TCO), such as, e.g., indium tin oxide (ITO), aluminum doped zinc oxide (AZO), boron doped zinc oxide (BZO) or other TCO materials or combinations of these or other materials. The transparent conductive layer 22 may include one or more layers 24, 26. The one or more layers 24, 26 may include different materials, e.g., layer 26 may include ITO while layer 24 may include ZnO. The transparent conductive layer 22 may include a thickness of between about 100 nm to about 5.0 microns. Layer 26 may form a contact for a photovoltaic device 10. Layer 24 may include a buffer layer to adjust the band gap difference between layer 18 and layer 26.

Metal contacts (not shown) may be formed on the transparent conductive layer 22 to further enhance the conductive properties of the transparent conductive layer 22. The metal contacts may include Ni, Al, Mo, Ag, Au, or any other suitable metal or alloy. Since the metal contacts are on the front, light receiving side of the device 10, their size should be optimized to minimize shadowing loss and resistive loss.

Conventional CZTSSe devices suffer from low open circuit voltage (Voc). This is in part due to p-type doping deficiency. The present principles provide a way to address this deficiency by diffusing In or other dopants into the junction between the absorber layer 16 and the semiconductor layer 18.

Figure 2:
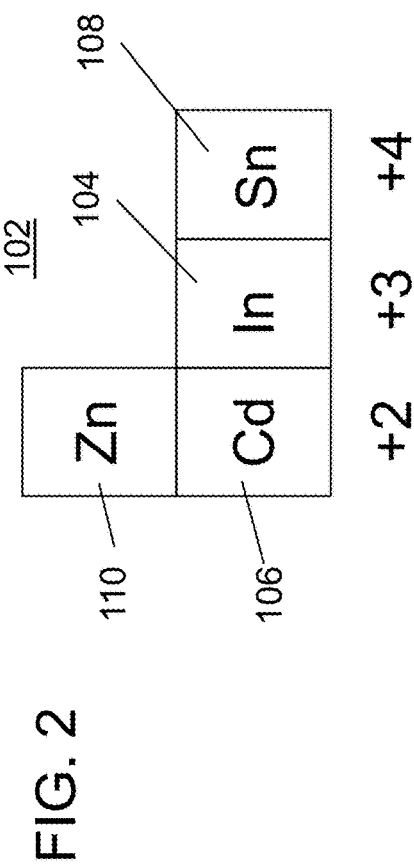
FIG. 2 is a diagram showing a relationship between valences for elements in an absorber layer, buffer layer and dopants in accordance with the present principles.

Referring to FIG. 2, a diagram shows a partial layout of showing relative positions of elements in a periodic table 102. The periodic table 102 includes element In 104 between element Cd 106 and element Sn 108. Element Zn 110 is also shown in the same column as element Cd 106. Indium (+3 valence) can be a p-type dopant element for CZTSSe (based on a +4 valence for Sn), and an n-type dopant for CdS, CdTe (based on a +2 valance for Cd (or Zn)). Since In can play a double role (n-type and p-type depending on the material that the In has doped) with respect to electronic activity at the p-n junction between layer 18 and layer 16 (FIG. 1), the built-in potential at the junction is increased (maximized). In accordance with the present principles, a dopant is selected for introduction into a p-n junction that has a valence between dominant valences of the neighboring materials forming the p-n junction. For example, In (+3)may be employed to dope a junction between CdS(+2) and CZTSSe (+4). Other combinations of materials are also contemplated.

Figure 3:
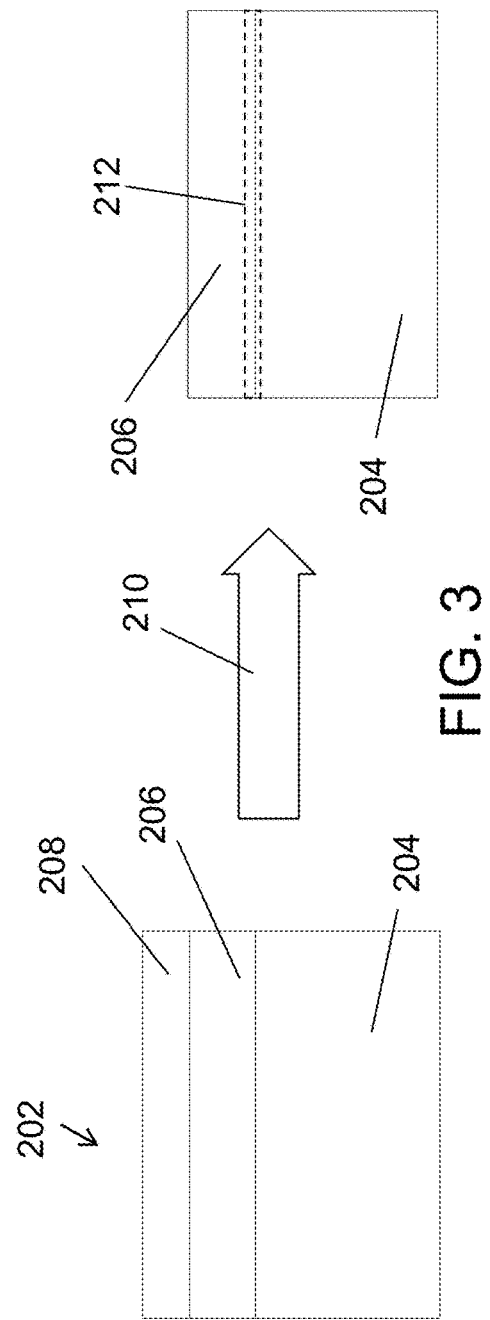
FIG. 3 is a diagram showing process steps for doping a junction region of a photovoltaic device in accordance with the present principles.

Referring to FIG. 3, an illustrative diagram depicts processing steps for doping a junction in a solar cell. In the embodiment depicted, a solar cell 202 includes an absorber layer 204, which may include CZTSSe. A semiconductor buffer layer 206, which may include CdS, is formed on the absorber layer 204 to form a junction therebetween. An ultrathin layer 208 is deposited on the buffer layer 206. The ultrathin layer 208 may include metallic In. The ultrathin layer 208 may include a thickness of between about 0.1 nm to about 1.0 nm. The ultrathin layer 208 may be depicted using a thermal evaporation process although other suitable deposition processes may be employed.

A rapid thermal anneal (RTA) 210 is performed to drive atoms of the ultrathin layer 208 into the buffer layer 206 and into the junction region between the buffer layer 206 and the absorber layer 204. In one embodiment, the RTA includes a 200 degree C. temperature for 30 seconds. The temperature and duration of the anneal may be adjusted to increase or decrease the doping concentration at the junction. For example, in one embodiment, In is diffused into the junction area to provide a dopant concentration of between about $10^{16}$-$10^{21}$ atoms/cm$^3$. In particularly useful embodiments, the dopant concentration may be between about $10^{17}$-$10^{18}$ atoms/cm$^3$. Other dopants, other than In, may also be employed.

The CZTSSe absorber layer 204 and the CdS buffer layer 206 are doped with In and may include a dopant region or profile 212 to increase the Voc, efficiency and fill factor (FF) of the solar device. The ultrathin layer 208 is preferably completely diffused into the buffer layer 206, although a small portion may remain on the surface of the buffer layer 208 as the layer is so thin it would not impact device operation.

Figure 4:
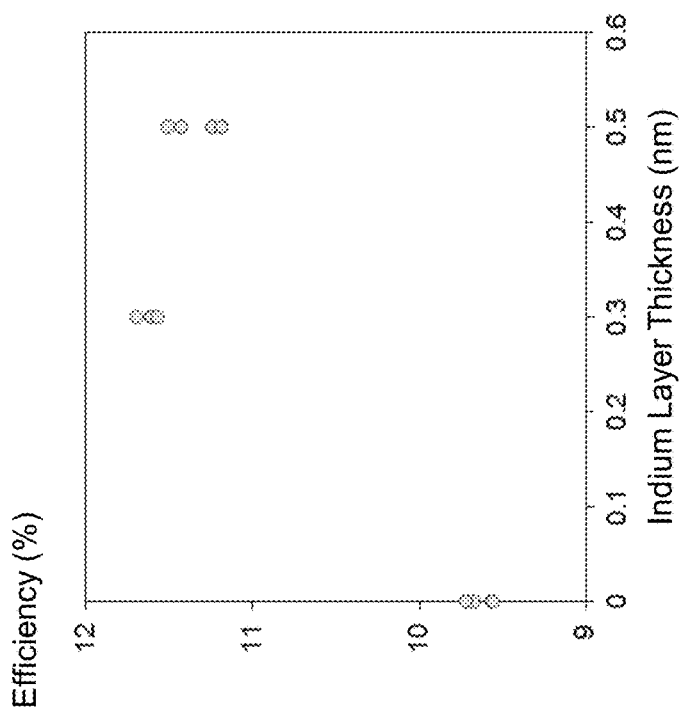
FIG. 4 is a graph plotting device efficiency (%) versus deposited layer thickness (nm) for an Indium layer that has been diffused into a junction region in accordance with the present principles.

Referring to FIG. 4, a graph shows efficiency (%) versus Indium layer thickness (nm). Data where In thickness is zero indicates that no In dopants where employed. As can be seen from the graph, the In layer thickness of about 0.3 nm provided an efficiency increase from about 9.7% (with no In) to about 11.7% .

Figure 5:
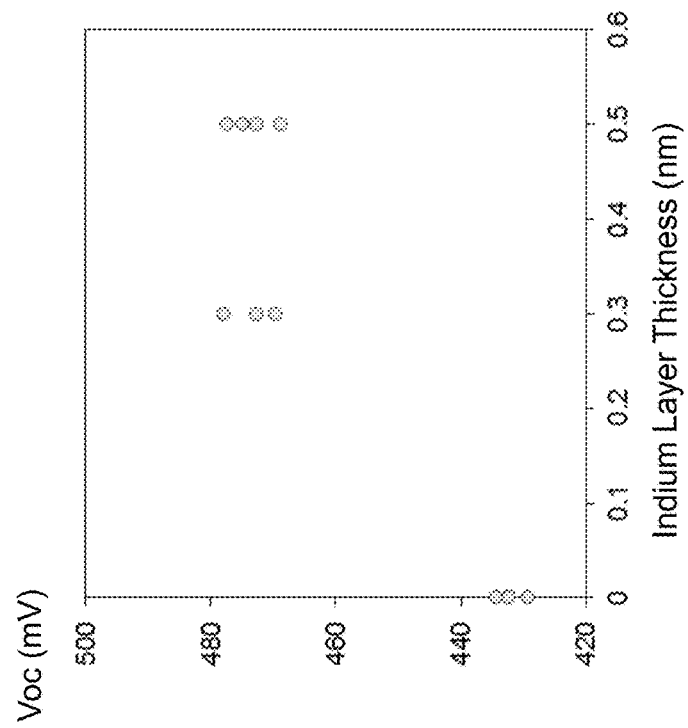
FIG. 5 is a graph plotting device open circuit voltage (Voc) (mV) versus deposited layer thickness (nm) for an Indium layer that has been diffused into a junction region in accordance with the present principles.

Referring to FIG. 5, a graph shows Voc (mV) versus Indium layer thickness (nm). Data where In thickness is zero indicates that no In dopants where employed. As can be seen from the graph, the In layer thickness of about 0.3 nm provided a Voc of about 478 mV over the Voc of about 435 mV with no In dopants.

Figure 6:
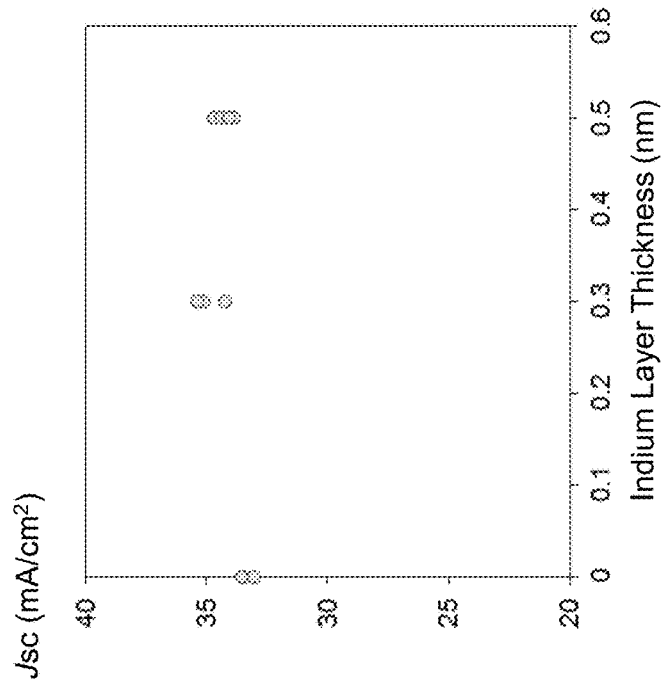
FIG. 6 is a graph plotting device fill factor (%) versus deposited layer thickness (nm) for an Indium layer that has been diffused into a junction region in accordance with the present principles.

Referring to FIG. 6, a graph shows fill factor (%) versus Indium layer thickness (nm). Data where In thickness is zero indicates that no In dopants where employed. As can be seen from the graph, the In layer thickness of about 0.3 nm provided a fill factor increase from about 67% (with no In) to about 71%.

Figure 7:
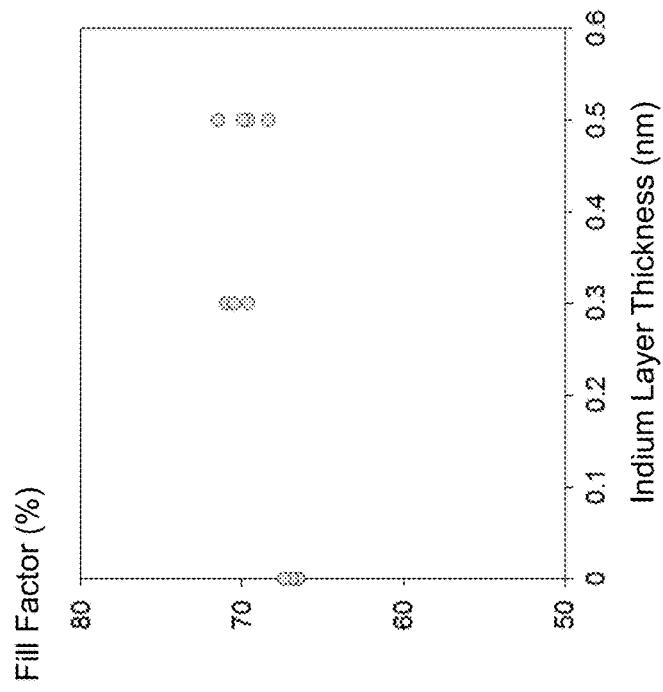
FIG. 7 is a graph plotting device short circuit current density (Jsc) (mA/cm$^2$) versus deposited layer thickness (nm) for an Indium layer that has been diffused into a junction region in accordance with the present principles.

Referring to FIG. 7, a graph shows short circuit current density Jsc (mA/cm$^2$) versus Indium layer thickness (nm). Data where In thickness is zero indicates that no In dopants where employed. As can be seen from the graph, the In layer thickness of about 0.3 nm provided a Jsc of about 35.5 mA/cm$^2$ over the Jsc of about 33.5 mA/cm$^2$ with no In dopants.

Figure 8:
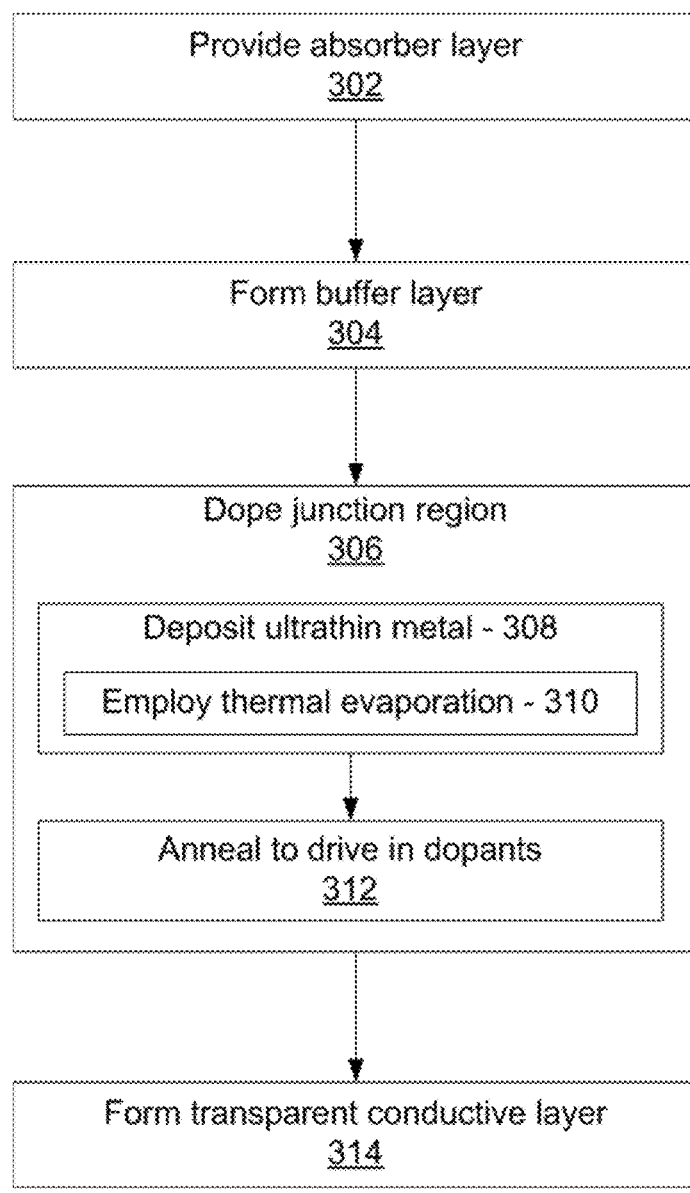
FIG. 8 is a block/flow diagram showing a method for forming a photovoltaic device in accordance with another illustrative embodiment.

Referring to FIG. 8, a method for forming a photovoltaic device is illustratively shown. In some alternative implementations, the functions noted in the blocks may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

In block 302, an absorber layer is provided on a first contact layer formed on a substrate. The absorber layer may include Cu—Zn—Sn—S(Se) (CZTSSe), and in particular, $Cu_{2-x}Zn_{1+y}Sn(S_{1-z}Se_z)_{4+q}$ wherein $0 \leq x \leq 1$; $0 \leq y \leq 1$; $0 \leq z \leq 1$; $-1 \leq q \leq 1$. In block 304, a buffer layer is formed in contact with the absorber layer. The buffer layer includes at least one of Cd or Zn. In one embodiment, the buffer layer includes one or more of CdTe, CdS, ZnS, Zn(O,S) or ZnO. In a particularly useful embodiment, the buffer layer includes CdS and the metal dopants include In metal. In this case, the CZTSSe includes a valence of +4 for its Sn, the In metal includes a valence of +3 and the CdS includes a valence of +2 for its Cd.

In block 306, a junction region is doped between the absorber layer and the buffer layer with metal dopants having a valence between the absorber layer and the buffer layer to increase junction potential. In block 308, doping a junction region includes depositing an ultrathin metal layer on the buffer layer. In block 310, depositing the ultrathin metal layer on the buffer layer includes employing a thermal evaporation process. The ultrathin metal layer may include a deposited thickness of between about 0.1 nm to about 1.0 nm. In block 312, an anneal is performed to diffuse the ultrathin metal layer into the buffer layer for doping the junction region. The junction region is doped to a dopant concentration of between about $10^{16}$-$10^{21}$ atoms/cm$^3$, and more particularly between about $10^{17}$-$10^{18}$ atoms/cm$^3$. In block 314, a transparent conductive contact layer is formed over the buffer layer.

Having described preferred embodiments for controllable indium doping for high efficiency CZTS thin-film solar cells (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

The invention claimed is:

1. A method for forming a photovoltaic device, comprising:
    providing an absorber layer initially devoid of indium (In) and including Cu—Zn—Sn—S(Se) (CZTSSe) on a first contact layer formed on a substrate;
    forming a buffer layer initially devoid of In and having a first surface and a second surface, the first and second surfaces in opposed relation to each other, such that the first surface is in contact with the absorber layer;
    diffusing In from an ultrathin In layer into the buffer layer such that a portion of the ultrathin In layer remains on the surface of the buffer layer, the ultrathin In layer having a valence value between dominant valence values of the absorber layer and the buffer layer; and
    forming a transparent conductive contact layer over the portion of the ultrathin In layer remaining on the buffer layer after In diffusion.

2. The method as recited in claim 1, wherein providing the absorber layer includes providing $Cu_{2-x}Zn_{1+y}Sn(S_{1-z}Se_z)_{4+q}$ wherein $0 \leq x \leq 1$; $0 \leq y \leq 1$; $0 \leq z \leq 1$; $-1 \leq q \leq 1$.

3. The method as recited in claim 1, wherein forming the buffer layer includes forming a semiconductor material including one of Cd or Zn.

4. The method as recited in claim 1, wherein the buffer layer includes one or more of CdTe, CdS, ZnS, Zn(O,S) or ZnO.

5. The method as recited in claim 1, wherein the buffer layer includes CdS.

6. The method as recited in claim 5, wherein the CZTSSe includes a valence of +4 for its Sn, the ultrathin In layer includes a valence of +3 and the CdS includes a valence of +2 for its Cd.

7. The method as recited in claim 1, wherein the ultrathin In layer has a thickness less than a thickness of the buffer layer.

8. The method as recited in claim 1, wherein depositing the ultrathin In layer on the buffer layer includes employing a thermal evaporation process.

9. The method as recited in claim 1, further comprising performing an anneal at a temperature of about 200° C. to diffuse the In into the buffer layer and the absorber layer.

10. The method as recited in claim 1, wherein the ultrathin In layer includes a deposited thickness of between about 0.1 nm to about 1.0 nm.

11. The method as recited in claim 1, wherein the ultrathin In layer includes a deposited thickness of between about 0.3 nm to about 0.5 nm.

12. The method as recited in claim 1, wherein the transparent conductive contact layer includes a plurality of layers.

* * * * *